United States Patent [19]

Dumbovic

[11] 4,263,582

[45] Apr. 21, 1981

[54] KEYBOARD WITH AN EXTERNALLY PROGRAMMABLE REPEAT RATE AND REPEAT DELAY RATE COUNTER

[75] Inventor: Steve Dumbovic, Elmhurst, Ill.

[73] Assignee: Illinois Tool Works Inc., Chicago, Ill.

[21] Appl. No.: 69,473

[22] Filed: Aug. 24, 1979

[51] Int. Cl.$^3$ .................................... G06F 3/02

[52] U.S. Cl. .................................... 340/365 S

[58] Field of Search ............ 340/365 R, 365 E, 365 S, 340/365 L; 178/17 C, 69 G, 79

[56] References Cited

U.S. PATENT DOCUMENTS

| | | | |
|---|---|---|---|
| 3,792,466 | 2/1974 | Arnold et al. | 340/365 E |
| 3,978,474 | 8/1976 | Engstrom | 340/365 E |
| 4,017,850 | 4/1977 | Wanatowicz, Jr. | 340/365 L |
| 4,024,534 | 5/1977 | Du Vall | 340/365 E |
| 4,106,011 | 8/1978 | Melanson et al. | 340/365 S |

OTHER PUBLICATIONS

"Digital Logic Handbook 1973-4", prepared by Logic Products Group, Digital Equipment Corporation, ©1973, pp. 72-77.

Hewlett-Packard Journal for Jun. 1975: "A Microprocessor-Scanned Keyboard", by O. Blazek, pp. 20-21.

*Primary Examiner*—Thomas A. Robinson
*Attorney, Agent, or Firm*—Thomas W. Buckman; Glenn W. Bowen

[57] ABSTRACT

An electronic keyboard is disclosed in which the keyboard matrix is scanned by an integrated circuit scanner which incorporates a programmable repeat rate and repeat delay rate counter. The repeat interval of a key is achieved by setting the repeat counter to a predetermined count value so that this repeat interval is obtained when a repeatable key has been depressed. The repeat delay rate interval is delayed by a count value that is set in the counter so that the repeat delay interval may be shortened when a repeatable key is held down for continued repeating of the code signal. In the keyboard an eight bit counter is utilized in which all eight bits can be used for the delay rate, but in all cases the four least significant bits are used for the repeat rate. Both the repeat rate and the delay rate are externally programmable during the same programming period, under the control of external processing equipment to which the keyboard is connected. External programming of the repeat rate and the repeat delay rate counter allows the keyboard to be produced at a reduced cost over microcomputer implemented keyboards.

5 Claims, 7 Drawing Figures

KEYBOARD WITH AN EXTERNALLY PROGRAMMABLE REPEAT RATE AND REPEAT DELAY RATE COUNTER

BACKGROUND OF THE INVENTION

The design of electronic keyboards has progressed to the point where integrated circuit microprocessors may be utilized to control the scanning and the outputting of data and function codes from such keyboards. One example of such a keyboard is described in the Hewlett-Packard Journal of June 1975, Pages 20 and 21, which is entitled "A Microprocessor-Scanned Keyboard," by Otakar Blazek. In the keyboard described by Blazek, the microprocessor was programmed to scan a keyboard switching matrix. When a repeat key was depressed the microprocessor set a repeat counter to a predetermined count value in order to provide the delay interval for the first repeated signal. The repeat counter was then reinitialized to a second value to determine the repeat delay rate interval between subsequent repeated signals. This subroutine was obtained by software programming of the microprocessor which controlled the keyboard scan.

The approach taken by the Hewlett-Packard system is applicable for a number of keyboard applications. However, there are many instances in which the relatively high cost of such a microprocessor is not necessary for the particular keyboard application, particularly where external programming of the repeat rate and repeat delay rate counter is feasible because the keyboard forms a part of a complete data processing system. In the Hewlett-Packard system the counter is first preset to a particular count to determine the repeat delay rate and then the counter is decremented to zero. Again the same counter field is preset to determine the repeat rate and the counter is decremented again to zero. Reloading of the counter field with the repeat rate count and decrementing the counter to zero continues until the keyswitch being repeated is released.

In the externally programmable keyboard of the present invention, an eight bit counter is used in which all eight bits can be used for the delay rate, but in all cases the four least significant bits are used for the repeat rate; and both the repeat rate and the repeat delay rate are externally, independently programmable during the same programming period. Another significant difference between the two keyboards is that the Hewlett-Packard keyboard uses a parallel loading bus to preset the counter, while in the keyboard of the present invention, the repeat counter is loaded in a serial manner in the scan cycle following the issuance of a strobe for the repeatable keyswitch. This is an important distinction, since without implementation of a serial loading method and external programming, the repeat counter could not reasonably be implemented in a circuit contained in a standard 28-pin package, and therefore, either a non-standard 34- or 36-pin package, or more probably, a 40-pin package would probably have to be utilized. The higher costs associated with such packages could well make an externally programmable integrated circuit keyboard unfeasible from a cost standpoint.

DESCRIPTION OF THE DRAWINGS

The present invention is illustrated by reference to the drawings in which.

TECHNICAL DESCRIPTION OF THE INVENTION

The keyboard of the present invention is designed to provide, in conjunction with suitable externally programmed signals, the following features:

(a) sequential, time-isolated, interrogation of a number of keyswitches in a keyswitch matrix, for example, 128 keyswitch stations;

(b) a seven bit data latch for the storage of one character;

(c) a flag generator capable of providing four flagged output signals;

(d) N-key rollover protection;

(e) external control for enabling the generation of an upstroke strobe and for supplying data output signals for certain selected keys;

(f) external control for inhibiting the generation of a strobe and the supplying of data output signals for certain selected keys;

(g) external controls for programming the repeat rate and the repeat delay rate intervals;

(h) external control for enabling an auto-repeat function;

(i) external control for enabling a repeat permit function; and (j) implementation in an integrated circuit, which can be packaged in a 28-pin standard, dual-in-line package.

Figure 3:
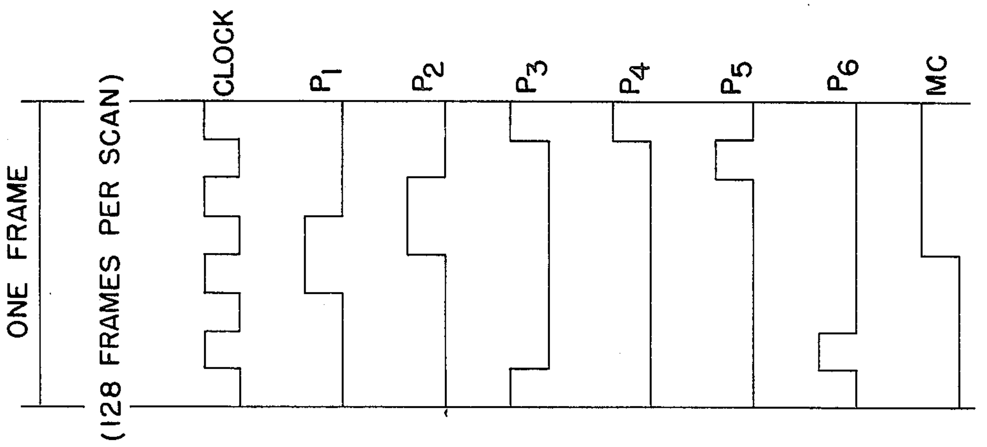
FIG. 3 represents a timing diagram for the keyboard.

The timing diagram for the keyboard is shown in FIG. 3. The top line of this timing diagram, which is labelled "Clock", represents a main clock signal train which is coupled to a timing generator that produces a Master Clock signal and also generates six clock phase signals. The clock phase signals are designated "$p_1$" through "$p_6$" in the diagram of FIG. 3, and the Master Clock pulse is illustrated on the bottom line of this diagram by the signal labelled "MC".

$p_1$ is the drive or enable signal. $p_1$, $\overline{p_1}$ provide internal gating to the Auto-Repeat flip-flop, to the Upstroke Inhibit flip-flop, to the Data In flip-flop, to the enable program gate, and to reset the Repeat Key flip-flop.

$p_2$, $\overline{p_2}$ generates Strobe, loads the Data Latch, loads the Data In signal into temporary storage, provides gating to the Repeat Permit flip-flop, resets the Data In flip-flop, and provides internal gating to the Upstroke Inhibit gate.

$p_3$ is used to clear or enable the External Data latch while $\overline{p_3}$ provides gating to the Enable Program gate.

$p_4$ is used as a shift pulse to the N-Key Rollover shift register, and provides gating to the Data In flip-flop.

$p_5$ is used to reset the first stage of the Repeat Permit flip-flop and the Program Permit flip-flop.

$p_6$ is used to reset the Repeat Permit flip-flop and the Program Permit flip-flop, to load address "0" into the seven bit Address Register, and to provide gating to the Repeat Rate and Delay latches.

The input to the timing section of the keyboard is a pulse train of a period of approximately 2.0 microseconds. The keyboard is designed to employ all static circuitry except for the quasi-static shift register. This design allows the clock to be stopped indefinetely at any time except during clock phase $p_4$.

Figure 1A:
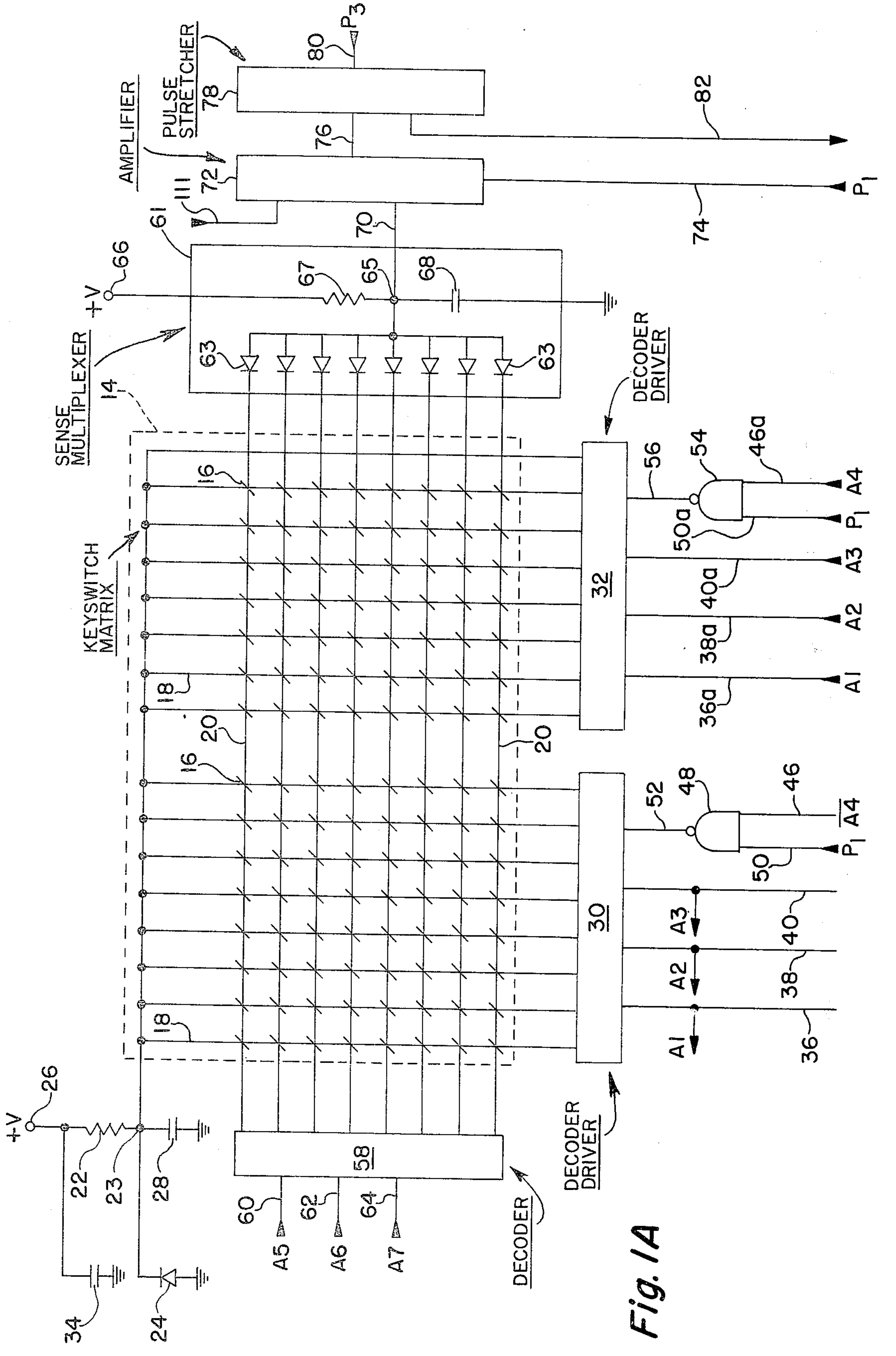
FIGS. 1A and 1B represent an overall block diagram of the present invention.

The present invention contemplates the use of mechanical, reed, Hall-effect or other types of conventional keyswitches; but the preferred embodiment of the invention employs an analog type of switch which may be a capacitive type of keyswitch, or a magnetic core type of switch, such as the one described in U.S. Pat. No. 4,017,850, issued Apr. 12, 1977, in the name of Edward W. Wanatowicz, Jr., and assigned to the assignee of the present invention. The description of the operation of a suitable type of analog magnetic keyswitch is also found in U.S. Pat. No. 3,978,474, issued Aug. 31, 1976, entitled "Keyboard with N-key Lock Out and Two-Key Rollover Protection," which issued in the name of Keith Allen Engstrom, and which also is assigned to the assignee of the present invention. The keyswitch matrix 14 is illustrated in FIG. 1A as having 128 keyswitch matrix locations, each of which has an associated closed-loop magnetic core 16 that is coupled to a drive line 18 and a sense line 20 at the point they intersect. There are 16 drive lines and 8 sense lines, for a total of 128 switching matrix locations.

In the operation of such a magnetic core switch, each core 16 of the matrix 14 acts as a transformer, wherein the drive lines 18 carry a current pulse that may be transformed to the sense lines 20 when the associated magnetic core 16 is not magnetically saturated. When the push button of the keyswitch at a matrix location is not depressed, a magnet carried by the keyswitch will be positioned adjacent the associated magnetic core 16 which is threaded by one of the drive lines 18 and by one of the sense lines 20. The magnetic core 16 of a particular keyswitch will thus be substantially magnetically saturated, when the pushbutton of the switch is depressed and the magnet of the switch is removed from the core, allowing it to come out of magnetic saturation, and thus, when the associated drive line 18 is supplied with a pulse of current an output signal will appear on the intersecting sense line 20.

The drive lines 18 are all connected to the junction point 23 of the resistor 22 and the cathode of the diode 24, and the anode of the diode 24 is connected to ground. One end of the resistor 22 is connected to the terminal 26 which has a positive voltage supply connected to it. A storage capacitor 28 is connected across the diode 24 to provide a high current, short duration surge through the drive line 18 that is grounded at a given time by the decoder-drivers 30, 32. The current that flows through the resistor 22 is relatively small in magnitude compared to the current that is supplied by capacitor 28 during discharge. The diode 24 eliminates the negative-going portion of the signal caused by the pulse of drive current that is supplied to the drive lines 18. The capacitor 34, which is connected from the terminal 26 to ground, is a noise filtering capacitor. The drive circuits 30, 32 are under control of the $p_1$ clock signal which must have a duration sufficient to allow the capacitor 28 to approximately reach the positive voltage potential that is applied to the terminal 26, after each pulse of current through a grounded drive line 18 has occurred. In one particular embodiment of the present invention, a positive 5 volts is connected to the terminal 26, the resistor 22 is 220 ohms, the capacitor 34 is 0.1 microfarads, the capacitor 28 is 4700 picofarads and the diode is a 1N4148 diode.

A Master Counter is located in the control circuit 10, and is described in more detail subsequently. The function of this Master Counter is to provide for sequential interrogation of each keyswitch in the matrix in succession on a time-isolated basis. The Master Counter is seven bits in length with the first four bits (A1–A4) being used to scan the drive lines 18 and the last three bits (A5–A7) being used to scan the sense lines 20. The Master Counter thus provides 128 unique codes, each of which correspond to a unique time-isolated time slot, or frame, for sensing a particular keyswitch of the matrix 14. The count of the Master Counter changes at the negative-going transition of each Master Count signal, and thus each count of the Master Counter forms a key frame which may be used for the interrogation of a different keyswitch of the keyboard. Interrogation takes place at the beginning of a $p_1$ clock signal and the keyswitch's condition is stored in a flip-flop. At the beginning of a $p_3$ signal, this storage flip-flop will be reset so that it may provide storage for the next key to be interrogated. The output bits A1–A3 of the Master Counter are supplied from the control circuit 10 on the output lines 36, 38, 40 and 36*a*, 38*a*, and 40*a* to the decoderdrivers 30, 32, respectively. The A4 signal is inverted by the inverter 44 to provide an $\overline{A4}$ output signal on the line 46. The output signal $\overline{A4}$ on the line 46 is supplied to one input of a NAND gate 48 (FIG. 1A), the other input of which is supplied on the line 50 with a $p_1$ clock signal. Thus, the output of the NAND gate 48 on the line 52 will be at a logic "0" level when the $p_1$ clock signal and the signal on the line 46 are both at a logic "1" level.

The output signal A4 on the line 46a is supplied to one input of the NAND gate 54, the other input of which receivers the $p_1$ signal on the line 50*a*. The NAND gate 54, therefore, provides a logic "0" level signal on the output line 56 upon the occurrence of a logic "1" level $p_1$ signal and a logic "1" level A4 bit signal. Thus, by use of the bits A1, A2, A3 and A4, all sixteen drive lines 18 that are connected to the decoder-drivers 30, 32 may be individually selected in succession under the control of the A4 bit and the $p_1$ clock signal, so that the presence of a logic "0" level signal on the line 52 or on the lines 56 selects either the decoder-driver 30 or the decoder-driver 32.

The most significant bits A5, A6 and A7 of the Master Counter of the control circuit 10 are coupled on the output lines 60, 62 and 64 to the decoder 58, whereby each of the eight sense lines 20 of the matrix 14 may be selectively grounded. The sense lines 20 are coupled to a sense multiplexer 61, which may consist of eight diodes 63, each of which have their cathodes connected to a separate one of the sense lines 20, and their anodes connected to a junction point 65. A resistor 67 is coupled between the junction point 65 and a terminal 66, which is coupled to a positive voltage supply. A noise filtering capacitor 68 is coupled to filter out switching transients between the junction point 65 and ground. During a particular time slot associated with a selected keyswitch of the matrix 14, actuation of the keyswitch will cause the selected sense line 20 to be at some predetermined voltage level. Consequently, the voltage on the junction point 65 between the resistor 67 and the capacitor 68 will rise, thereby providing an output signal on the line 70 which indicates that one of the keys of the matrix 14 has been actuated.

The output line 70 from the sense multiplexer 61 is coupled to the input of a threshold detector amplifier 72 which is clocked with a $p_1$ signal on the line 74. Thus, the signal from the threshold detector amplifier 72 will be coupled out on the output line 76 when the $p_1$ clock signal goes to a logic "1" level. A conventional pulse stretching circuit 78 may be coupled to receive the signal on the line 78, so as to provide a logic "1" level output signal on the line 82 when the $p_1$ clock signal occurs. The output signal from the pulse stretching circuit 78 will last until the $p_3$ signal that is clocked into the pulse stretching circuit 78 on the line 80 goes to a logic "1" level. Therefore, the output pulse from the pulse stretching circuit 78 on the line 82 will be of a duration determined by the rise with the $p_1$ signal and the rise of the $p_3$ signal. In this manner, an output signal pulse on the line 82 of a predetermined width is achieved, even though the input signal pulse on the line 76 may be of a shorter duration.

Figure 1B:
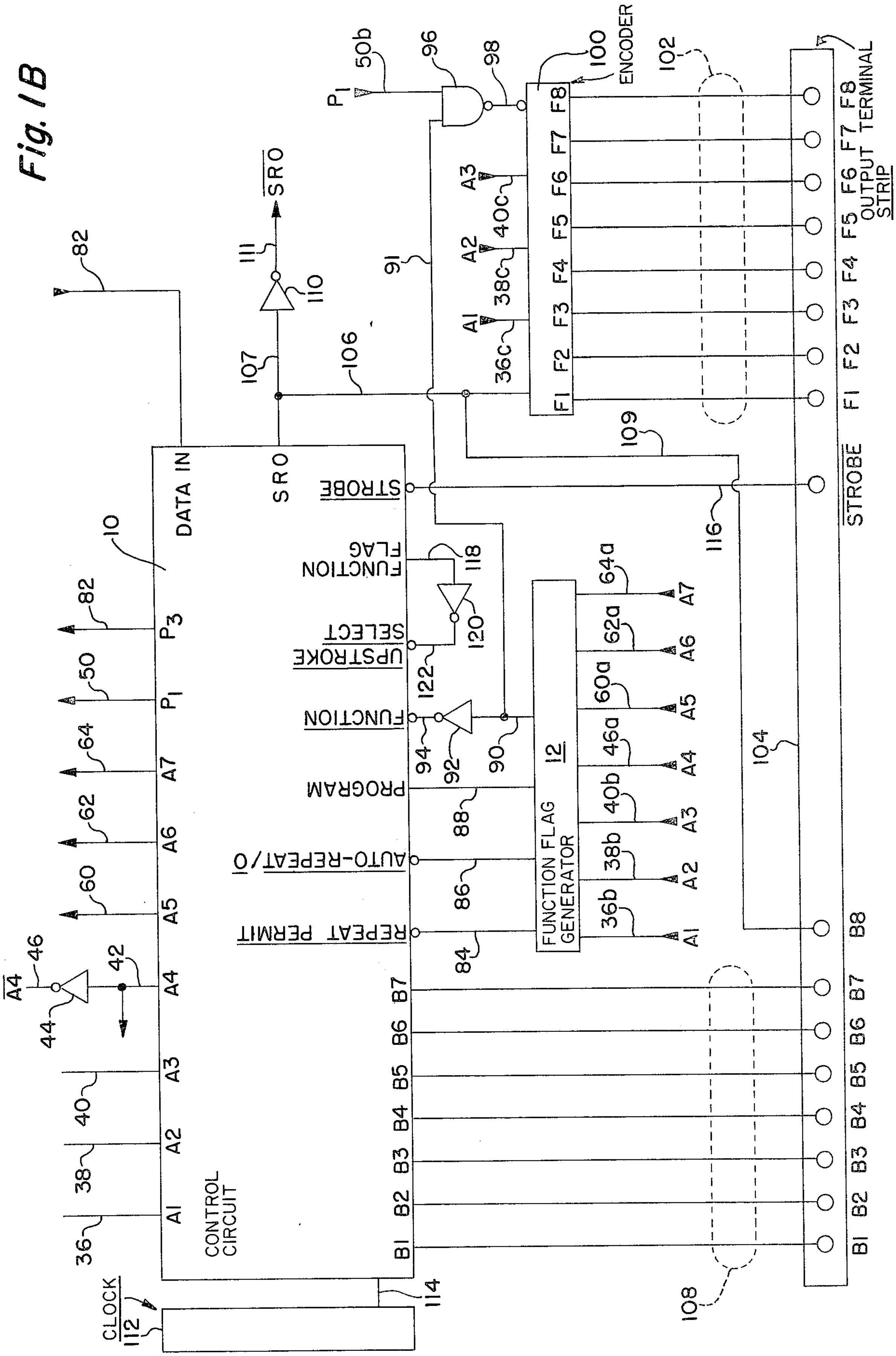
Figure 2A:
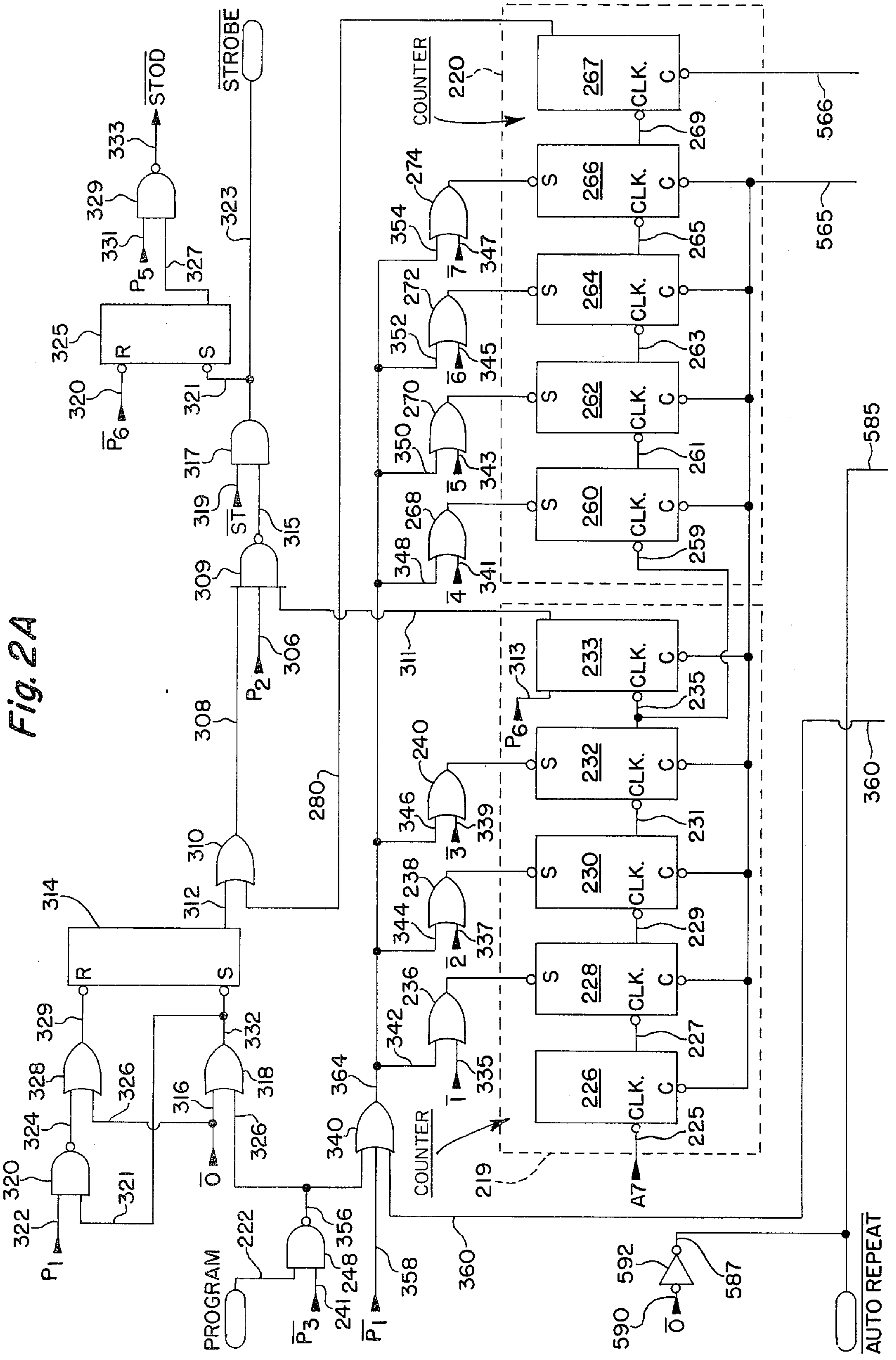
FIGS. 2A, 2B, 2C and 2D represent a block diagram of the control circuit 10.
Figure 2B:
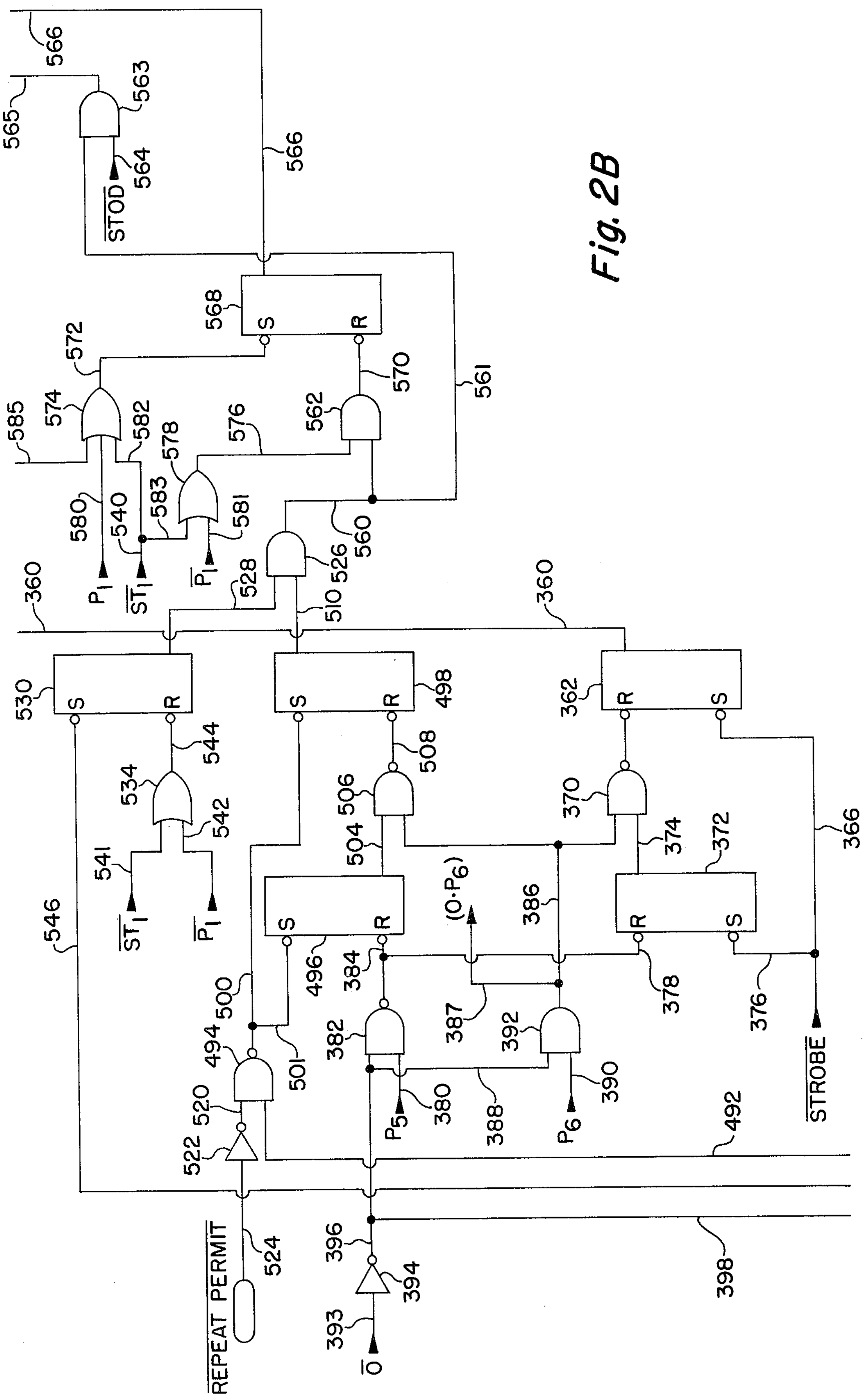
Figure 2C:
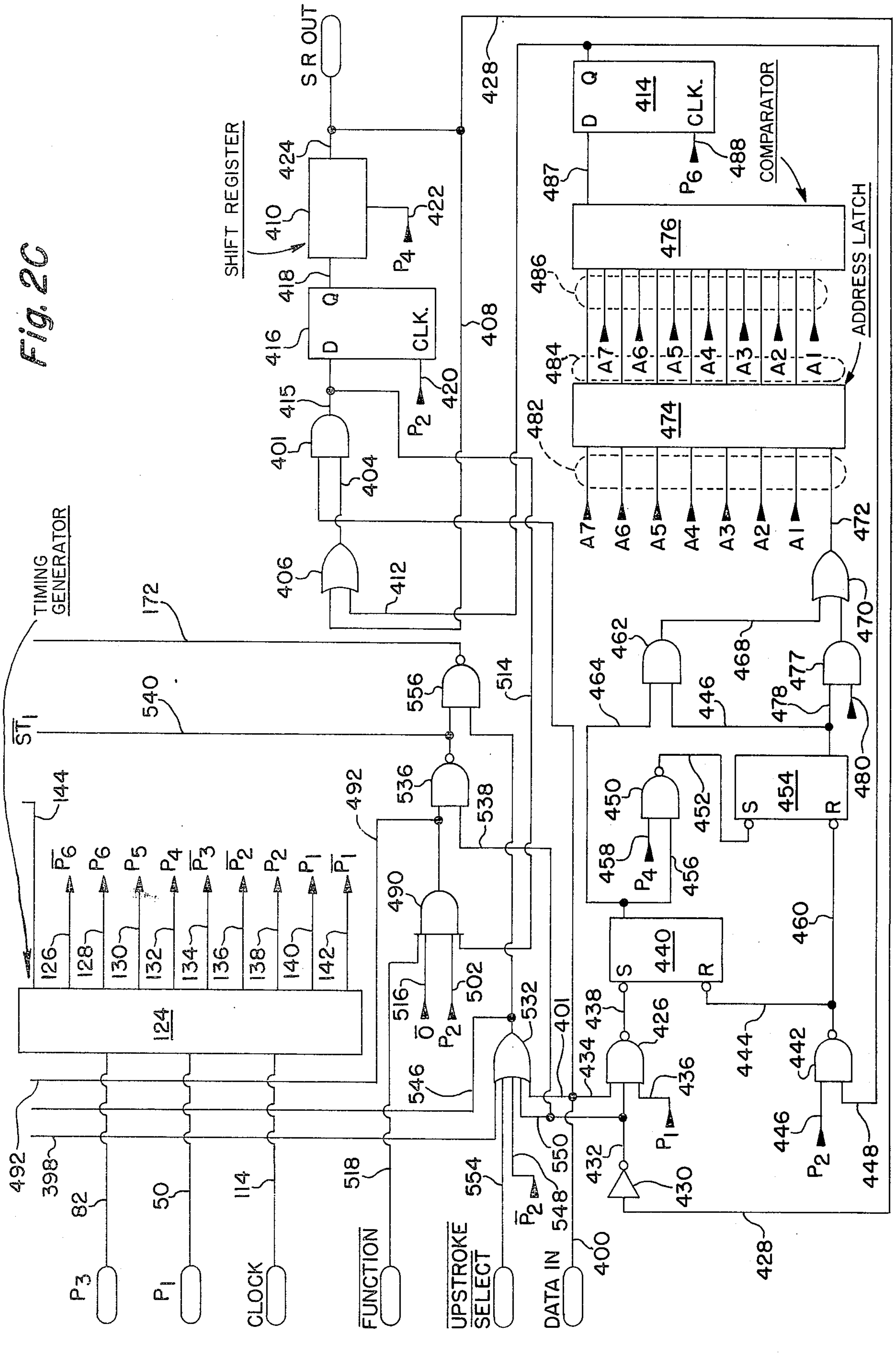

FIGS. 1A and 1B are a block diagram representation of the overall keyboard, while FIGS. 2A, 2B and 2C represent a block diagram of the control circuit 10. The block 12 of FIG. 1B represents a function flag generator which is coupled to the control circuit 10 and which may be a conventional decoder in which a seven bit input signal is decoded to provide the particular function signals that are required by the control circuit 10.

The count bits A1–A7 are also supplied to the function flag generator 12 (FIG. 1B) on the lines 36*b*, 38*b*, 40*b*, 46*a*, 60*a*, 62*a*, and 64*a*. The function flag generator 12 operates to provide four output signals, each of which is individually produced in accordance with the existence of a particular combination of coded bits on these input lines. These output signals from the flag generator 12 represent various function codes which are utilized by the control circuit 10 to program the repeat rate and repeat delay rate counts into the programmable counter. The output line 84 represents a function signal which is labelled $\overline{\text{Repeat Permit}}$, indicating that a logic "0" level occurs when this output signal is produced. The output signal that appears on the line 86 is labelled $\overline{\text{Auto-Repeat}/0}$, meaning that this line may carry either an $\overline{\text{Auto Repeat}}$ signal or a $\overline{0}$ signal which is representative of key location zero. The line 88 carries a signal which is called a Program signal. A signal on the output line 90 from the flag generator 12 will be inverted by the inverter 92 and supplied on the line 94 into the control circuit 10. The output signal on the line 94 is labelled $\overline{\text{Function}}$, and is utilized to indicate that the key that has been depressed is a function key rather than a data key.

The Function signal that appears on the line 90 is also supplied on the line 91 to one input of a NAND gate 96, the other input of which is supplied a $p_1$ clock signal on the line 50b, so that a logic "0" level output signal will appear on the line 98 when both of the input lines 91 and 50*b* are at a logic "1" level. The output line 98 from the gate 96 is coupled to an addressable register encoder 100, to serve as a gating signal for this register encoder. The code developed by the register encoder 100 is coupled out on the lines 102 to an output terminal strip 104 as encoded bits F1–F8. These encoded bits are derived from the address bits A1–A3 which are supplied on the input lines 36*c*, 38*c*, and 40*c* to the encoder 100. A SRO, or Shift Register Output signal, is supplied on the line 106 to the encoder 100. The SRO signal is also supplied by the control circuit 10 on the line 107 to the inverter 110. This signal comes from the N-key rollover protection circuitry of the control circuit 10, and it functions to provide a logic "1" level signal in the proper time slot for a particular keyswitch that is actuated during the scan cycle in which this keyswitch has first been actuated. The inverter 110 inverts the signal on the line 107 to provide an $\overline{\text{SRO}}$ output signal on the line 111. This line is coupled to the threshold detector amplifier 72 and is used as a hysteresis signal to prevent false generation of multiple data output signals. The purpose of this "hysteresis feedback" path is to avoid an erroneous multiple output signal that could otherwise result from a "teasing" of a keyswitch in the absence of such a path. This is accomplished by the hysteresis feed-back path which reduces the threshold level of the amplifier 72.

A train of clock pulses is supplied by the clock generator 112 on the line 114 to the control circuit 10. The $p_1$–$p_6$ signals and the "MC" clock pulses are all derived from the signal from the clock generator 112 in a timing generator that is located in the control circuit 10. The control circuit 10 also has an output which is labelled $\overline{\text{Strobe}}$ which is supplied on the line 116 to output terminal strip 104. This output signal is used to indicate to the external equipment, which is coupled to the keyboard, that a group of data code bits B1–B7 are present on the lines 108. An output Function Flag signal is supplied on the line 118 from the control circuit 10 to an inverter 120 which inverts this signal and supplies the inverted signal on the line 122 as an input signal to the control circuit 10 which is labelled $\overline{\text{Upstroke Select}}$. This signal indicates when a depressed key is released so that a stobe can be generated. The SRO signal on the line 106 may be used to indicate difference between downstroke and upstroke data, if desired, on the line 109 that is labelled B8.

While a general description of the keyboard has this far been provided, the portion of control circuit 10 that is illustrated in FIG. 1B will be described in more detail by reference to FIGS. 2A, 2B, 2C, and 2D in which the control circuit 10 is represented in block diagram form. In the discussion that follows the input and output terminals of FIGS. 2A–2D are labelled in the same manner that they were labelled in FIGS. 1A and 1B.

The "Clock" signal, which is developed by the clock 112 and is supplied on the line 114 is coupled to a timing generator 124 in the control circuit 10. The timing generator 124 converts the "Clock" signal to the various clock phase signals $p_1$–$p_6$, and the Master Count "MC" signal which are required by the keyboard. The clock phase signals $p_1$ and $p_3$ are supplied as output signals from the timing generator on the lines 50 and 82 for use by the keyboard system externally of the control circuit 10. The clock phase signals $\overline{p_6}$, $p_6$, $p_5$, $p_4$, $\overline{p_3}$, $\overline{p_2}$, $p_2$, $p_1$, and $\overline{p_1}$ are supplied on the lines 126–142, respectively, for use as internal gating signals by the control circuit 10, where the inverse clock phase signals, such as $\overline{p_6}$ are inverse of the corresponding noninverted clock phase signal, such as the clock phase signal $p_6$.

Figure 2D:
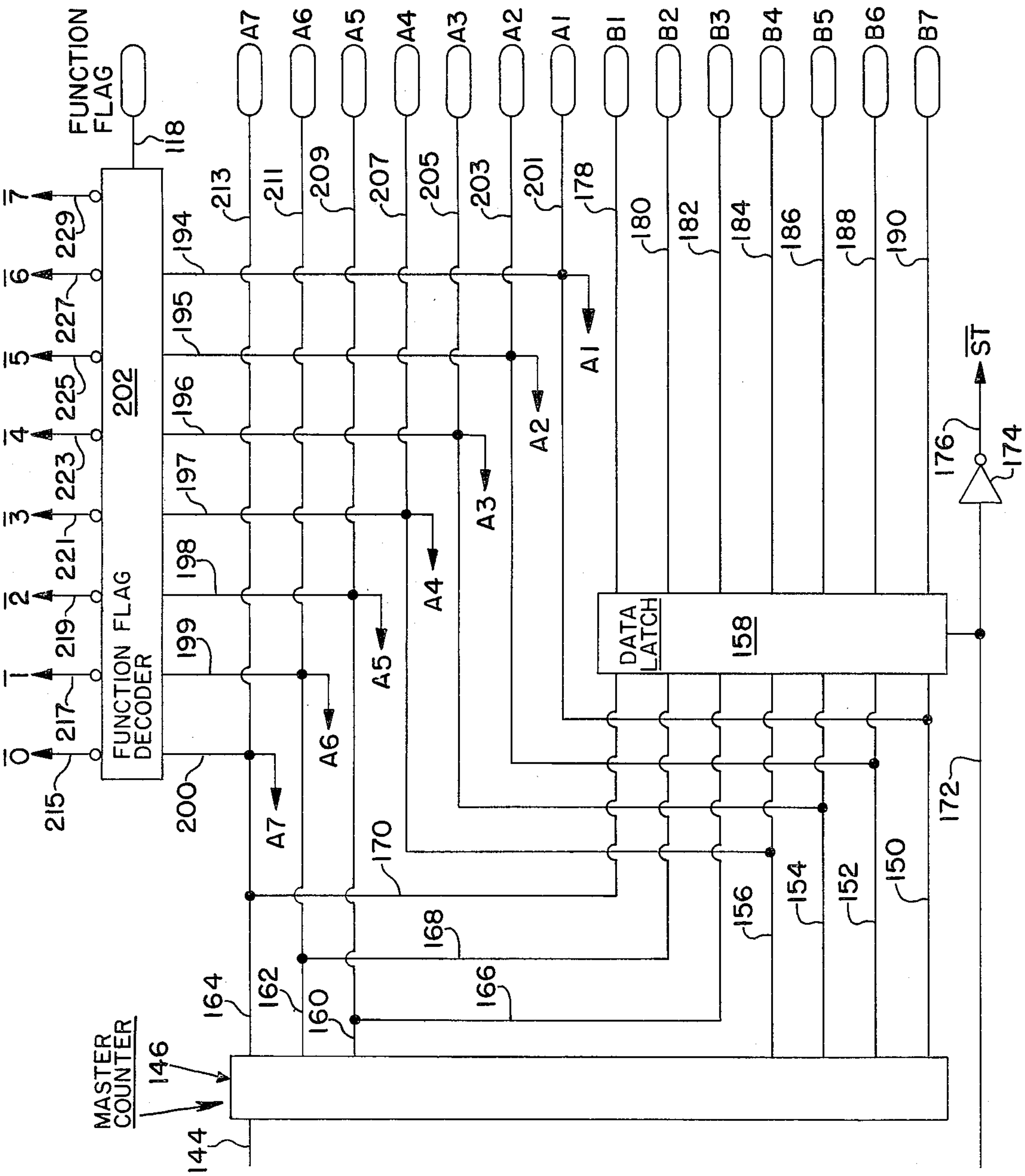

The Master Count pulse signal "MC" is supplied on the line 144 as a timing pulse to the Master Counter 146 (FIG. 2D). The counter 146 is a seven bit binary counter, and thus, it has a capacity of 128 counts. The output count bits A1–A4 are provided by the counter 146 on the output lines 150, 152, 154 and 156. The count bit A1 is the least significant bit that is produced by the Master Counter 146. The output counts A5–A7, wherein A7 is the most significant bit of the Master Counter, are supplied on the output lines 160, 162, and 164, and on the connecting lines 166, 168, and 170 to the Data Latch 158. The Data Latch 158 is utilized to provide storage of the count bits A1–A7. The counter 146, therefore, supplies a total of seven count bits, which are capable of supplying coded signals for a 128 keyswitch matrix in accordance with the previously described matrix driving and sensing scheme. The count bits in the Data Latch 158 are retained until a gating signal appears on the line 172. This signal occurs either when a new data key is depressed, or in the Upstroke Select mode, when a data key is released.

The inverter 174 inverts the signal on the line 172 and supplies this inverted signal on the line 176, which is labelled $\overline{ST}$. The $\overline{ST}$ signal is used in another portion of the control circut 10, as will subsequently be described. The count bits A1–A7 that are stored in the Data Latch are supplied on the lines 178–190 as output data bits B1–B7, which are representative of a particular depressed keyswitch during a scan of the matrix 14. The count bits A1–A7 from the counter 146 are also supplied on the interconnecting lines 194–200 to a function flag decoder 202 and they are also supplied on the lines 201–213 to any associated external circuits, as previously mentioned. The function flag decoder 202 provides various combinations of decoded output signals on the lines 215–229 which are used to program the repeat rate and repeat delay rate intervals, as desired by the user of the keyboard; and in addition, a Function Flag output signal is supplied by the function flag decoder 202 on the line 118. A function flag, for example, may be generated whenever the A5 bit and one of the A1–A4 bits are the only bits at a logic "1" level. This coding scheme provides for four separate function codes, but obviously many other types of codes may be employed within the scope of the present invention.

The decoder 202 produces logic "0" level signals on the lines 215–229 that are respectively labelled $\overline{0}$ through $\overline{7}$ whenever the bits A1–A4 are all at a logic "0" level according to the count specified by the bits A5–A7. A logic "0" level signal is produced on the line 215 which represents a "location zero" signal when all of the bits A1–A7 are at a logic "0" level. For example, the line 217 will provide a logic "0" level $\overline{1}$ signal when the A5 bit is the only bit at a logic "1" level and the line 219 will provide a logic "0" level $\overline{2}$ signal when the A6 bit is the only bit at a logic "1" level. In other words, the particular line of the lines 215–229 that goes to a logic "0" level is determined by the decoded count of the bits A5–A7 only, when the bits A1–A4 are all at a logic "0" level. The logic "0" level signals on the lines 215–229, thus, represent the count state of the bits A7–A5 with A5 being the least significant bit of the count.

The serially coupled counters 219, 220, shown in FIG. 2A, control the repeat rate and repeat delay rate intervals. The counters 219 and 220 are programmable when an externally supplied Program signal is applied on the input line 222 and other conditions are met, as described below. The Program signal is one of four function code signals that are produced by the function generator 12 of FIG. 1B.

The counter 219 is a four bit binary counter that consists of the counting flip-flops 226, 228, 230 and 232, and an output flip-flop 233. The counter 220 is a four bit binary counter that consists of the counting flip-flops 260, 262, 264 and 266, and the output flip-flop 267. The counting flip-flops 228, 230 and 232 of the counter 219 may be programmed (i.e., set) under the control of the gates 236, 238 and 240, respectively, to determine the repeat rate interval of the keyboard. The counting flip-flops 260, 262, 264 and 266 may be programmed under the control of the gates 268, 270, 272, and 274, respectively, to determine the repeat delay rate interval of the keyboard. All of these counting flip-flops are cleared by the application of a logic "0" level signal to the line 565 from the gate 563.

The most significant bit A7 of the Master Counter is supplied by the counter 146 on the line 225 as an input signal to the clock input terminal of the first stage flip-flop 226 of the counter 219. The output of the flip-flop 226 is applied to the clock input terminal of the flip-flop 228 on the line 227. The output of the flip-flop 228 is coupled to the clock input terminal of the flip-flop 230 on the line 229. The output of the flip-flop 230 is coupled to the clock input terminal of the flip-flop 232 on the line 231. The output of the flip-flop 232 is coupled to the clock input terminals of both the output flip-flop 233 of the counter 219 and the first stage flip-flop 260 of the counter 220 on the lines 235 and 259, respectively. The output of the flip-flop 260 is coupled to the clock input terminal of the flip-flop 262 on the line 261, while the outputs of the flip-flops 262, 264 and 266 are coupled on the lines 263, 265 and 269 to the next succeeding flip-flop in the counter 220. The designations "C," "CLK," "S" and "R" in the drawings of this embodiment of the present invention represent clear, clock, set and reset terminals, respectively. When a small circle appears on the line to any flip-flop adjacent a terminal, such as the circle 225 on the clock or "CLK" input to the flip-flop 226, this indicates that a signal inversion occurs before the signal is transferred to the flip-flop. D-type flip-flops have "D" labelled input terminals and "Q" labelled output terminals, as is conventional, while the above-mentioned "S" and "R" labels apply to RS type flip flops.

By the above-described connections, a counter is produced in which the output of each of the flip-flop stages 226, 228, 230, 232, 260, 262, 264, and 266 will change its state upon the transition of the A7 count signal from a logic level "1" to a logic level "0". The NAND gate 248 receives the Program signal as one input on the line 222, and the $\overline{p_3}$, or the inverted $p_3$ clock signal on the line 241 as its other input. The NAND gate 248 will, therefore, provide a logic "1" level output if the Program signal is at a logic "0" level, indicating that no external Program signal is being received. One input of the OR gate 318 is supplied from the output of NAND gate 248 on the line 326. The OR gate 318 thus supplies a logic "1" level signal to the set input terminal of the Repeat Key flip-flop 314 on the line 332. The flip-flop 314 will be reset when the OR gate 328 simultaneously provides a logic "0" level output signal on the line 329 to the reset input terminal of the flip-flop.

Since the line 332 is at a logic "1" level, the input line 321 to the NAND gate 320 will also be at a logic "1" level. The $p_1$ clock signal is applied on the line 322 to a second input of the NAND gate 320. The output of the NAND gate 320 will then go to a logic "0" level when $p_1$ is true, or at a logic "1" level. The output of the NAND gate 320 is coupled on the line 324 to one input of the OR gate 328, the other input of which receives the $\overline{0}$ signal from the Function Flag Decoder 202 on the line 326. The $\overline{0}$ signal is also applied on the line 316 to the other input of the OR gate 318, the output of which is coupled on the line 329 to the reset input terminal of the flip-flop 314. Hence, when the Program signal is not being received the flip-flop 314 will be reset when the $p_1$ signal goes to a logic "1" level on the line 322 and the outputs of the NAND gate 320 and OR gate 328 both go to a logic "0" level.

The Repeat Key flip-flop 314 will be set when the output of the OR gate 328 is at a logic "1" level and the output of the OR gate 318 is at a logic "0" level. To achieve, this, the output of the NAND gate 248 on the line 326 must be at a logic "0" level and the $\overline{0}$ signal must be at a logic "0" level. The outputs of both the NAND gate 320 and the OR gate 328 will then be at a logic "1" level when the $\overline{p_3}$ on the line 241 and the Program signal on the line 222 both go to a logic "1" level. When the flip-flop 314 is reset, its set output on the line 312 to one input of the OR gate 310 will be at a logic "0" level, thereby allowing the state of the OR gate 310 to be determined by the state of the output flip-flop 267 of the delay rate counter 220, which supplies an output on the line 280 to the other input of the OR gate 310. When the Program signal is at a logic "0" level, the gate 310 will not provide a logic "1" level output signal until the line 280 goes to a logic "1" level. The line 280 is coupled to the output of the output flip-flop 267 of the Repeat Delay Rate Counter 220. If the Program signal is at a logic "1" level, or a true state, the flip-flop 314 will be set and the output of the OR gate 310 will immediately go to a logic "1" level.

The output of the OR gate 310 is supplied on the line 308 to one input of the NAND gate 309. The other inputs to the NAND gate 309 consist of the $p_2$ clock signal that is supplied on the line 306, and the output of the output flip-flop 233 of the delay rate counter 219 on the line 311. The output of the NAND gate 309 on the line 315 will, therefore, go to a logic "0" level if the output of the OR gate 310 is at a logic "1" level upon the first occurrence of the $p_2$ signal on the line 306 when the counter 219 reaches a count of 16 and a logic "0" level $p_6$ signal occurs on the input line 313 to the output flip-flop 233.

The logic "0" level signal on the line 315 is supplied on one input of the AND gate 317. The other input of the AND gate 317 is supplied the $\overline{\text{ST}}$ signal on the line 319 from the line 176 of FIG. 2D. When the line 315 or the line 319 is at a logic "0" level, the output of the AND gate 317 on the lines 321 and 323 will also go to logic "0" levels and with a logic "1" level $\overline{p_6}$ signal on its reset input terminal, the flip-flop 325 will be set. The output signal on the line 323 represents the $\overline{\text{Strobe}}$ signal to the external equipment. When the delayed strobe flip-flop 325 is set, a logic "1" level output signal results on the line 327 which is connected to one input of the NAND gate 329. The other input of the NAND gate 329 receives the $p_5$ signal on the line 331 so that the $\overline{\text{STOD}}$, or delayed strobe signal, from the output of the NAND gate 329 on the line 333 will be at a logic "0" level when the flip-flop 325 is set and a $p_5$ signal occurs. The $\overline{\text{STOD}}$ signal resets the flip-flops 226–233 and 260–266 of the counters 219 and 220. The flip-flop 325 is reset when the $\overline{p_6}$ signal on the line 320 goes to a logic "0" level.

The OR gates 236–240 and 268–274, as previously mentioned, are used to selectively preset the flip-flop stages 228–232 of the repeat rate counter 219 and the flip-flop stages 260–266 of the repeat delay rate counter 220, respectively. These flip-flop stages will be set whenever the OR gate connected to its set terminal, marked S in FIG. 2A, goes to a logic "0" level. In order to go to a logic "0" level both of the inputs to each OR gate must be at a logic "0" level. One input of each OR gate is connected to receive one of the output lines 217–221 of the function flag decoder 202. The $\overline{1}$ signal is supplied to the line 335 as an input to the OR gate 236. The $\overline{2}$ signal is supplied to the line 337 on an input to the OR gate 238. The $\overline{3}$ signal is supplied to the line 339 as an input to the OR gate 240. These three signals from the decoder 202, therefore, control the programming of the rate delay counter 219 to establish a desired preselected repeat rate delay. The other inputs of the OR gates 236, 238, and 240 are connected to the output of the OR gate 340 which controls the actuation of these gates at the proper time in a manner which will be subsequently described, by application of a logic "0" level signal on the input lines 342, 344 and 346 of the OR gates 236, 238 and 240, respectively.

The $\overline{4}$ signal is supplied to the line 341 as an input signal to the OR gate 268. The $\overline{5}$ signal is supplied to the line 343 as an input signal to the OR gate 270. The $\overline{6}$ signal is supplied to the line 345 as an input signal to the OR gate 272. The $\overline{7}$ signal is supplied to the line 347 as an input signal to the OR gate 274. These four signals, therefore, control the programming of the repeat delay rate counter 220 to establish a desired preselected repeat delay rate. The other inputs of the OR gates 268, 270, 272 and 274 are connected to the output of the OR gate 340 via the input lines 348, 350, 352 and 354, respectively, to control the actuation of these gates at the proper time by the application of a logic "0" level signal to them.

The OR gate 340 receives an input on the line 356 from the output of the NAND gate 248 upon the occurrence of logic "1" level Program and a $\overline{p_3}$ signal on the lines 222 and 241, respectively. The line 358 to the second input of the OR gate 340 carries the $\overline{p_1}$ signal. The third input to the OR gate 340 is supplied on the line 360 from the reset output of the Program Permit flip-flop 362. Thus, when all of the input signals on the lines 356, 358 and 360 are at logic "0" levels the output of the OR gate 340 will be at a logic "0" level and will be supplied on the line 364 to all of the OR gates 236–240 and 268–274.

The Program Permit flip-flops 362 and 372 receive the $\overline{\text{Strobe}}$ signal, from the line 323, on the input lines 366 and 376 to their set input terminals so that a logic "0" level signal on these lines will set the flip-flops 362 and 372. When the flip-flops 362 and 372 are set a logic "0" level signal appears on the output lines 360 and 374. One input of the NAND gate 370 is connected to the reset output of the flip-flop 372. The flip-flop 372 will be set when the $\overline{\text{Strobe}}$ signal on the line 376 to its set input terminal is at a logic "0" level and the input on the line 378 to its reset input terminal is at a logic "1" level. The $\overline{\text{Strobe}}$ signal on the lines 366 and 376 can be at a logic "1" level only during the time the $p_2$ signal is at a logic "1" level.

The flip-flop 362 will not be reset until the flip-flop 372 is reset, (so that a logic "1" level signal is applied to the line 374), a simultaneous logic "1" level signal is supplied on the line 386 to the other input of the NAND gate 370 and the $\overline{\text{Strobe}}$ signal on the line 366 is at a logic "1" level. The lines 386 (and 387) can go to a logic "1" level only if both of the inputs on the lines 388 and 390 to the AND gate 392 are at a logic "1" level. The signal supplied to the input line 390 is the $p_6$ signal while the signal supplied to the input line 388 is derived from the output of the inverter 394 that is coupled to the lines 396 and 398. The input to the inverter 394 on the line 393 is the 0 signal from the line 215 of the function flag decoder 202. The line 396 thus couples a 0 signal to input terminals of both NAND gate 382 and the AND gate 392. The NAND gate 382 will thus provide a logic "0" level signal on the line 378 which allows the flip-flop 372 to be reset upon the start of the next scan following a $\overline{\text{Strobe}}$ signal output and the occurrence of a logic "1" level $p_5$ signal on the input line 380 to the gate 382. However, since the $p_6$ signal applied to the line 390 occurs prior to the $p_5$ signal, as shown in FIG. 3, the flip-flop 362 will not be reset until the next scan time when the $p_6$ signal gates a logic "1" level set signal through the gate 392 to the NAND gate 370. The Repeat Permit flip-flop 362, therefore will provide a logic "0" level signal on the line 360 that lasts for one full scan time plus the remaining duration of the scan during which keyswitch actuation occurred, in order to provide adequate time to achieve programming of the counters 219 and 220.

The "Data In" signal that is developed by the pulse stretching circuit 78 of FIG. 1A is supplied from the line 82 to the line 400 of FIG. 2C. Each detected actuated keyswitch thus supplies a logic "1" level signal on the line 400, once each scan cycle, during the time frame that is associated with that keyswitch. The "Data In" signal on the line 400 goes to one input of the AND gate 401, while the other input of the AND gate 401 is connected to the line 404 to receive an output signal from the OR gate 406. The OR gate 406 has one input coupled to the line 408, which receives the output of a shift register 410 which has a number of stages equal to the number of counts of the Master Counter that related to N-key rollover. The other input of the OR gate 406 is coupled to the line 412 which is connected to the Q output of the D type flip-flop 414. The OR gate 406 will thus apply a logic "1" level signal on the line 404 whenever a logic "1" level input signal is supplied on either the line 408 or the line 412.

The 128 bit shift register 410, and associated circuitry, provides an N-key rollover protection system which is capable of providing this protection for up to 128 keyswitches. Construction details of an N-key Rollover Protection System to eliminate these errors, which uses a shift register and a comparator, may be found in the patent application of Keith A. Engstrom, U.S. patent application, Ser. No. 457,884 filed Apr. 4, 1974, which is assigned to the assignee of the present invention. An N-Key Rollover Protection System allows the transmission of the code for a given key switch upon the depression of that key switch regardless of the state of any other key switch in the keyboard matrix. A key detect signal is generated in the N-Key Rollover Protection System of the prior Engstrom application for each new actuation of a keyswitch, and thus, the letters t, h and e of the word, "the" will be read out as they are sequentially actuated.

The N-Key Rollover Protection System is constructed in the keyboard of the prior Engstrom application by use of a shift register, which has a number of stages that are equal to the maximum number of key switches in the keyboard matrix, and a comparator. The output of the shift register, which represents the state of a particular key switch during the last scan cycle, is compared with the state of the key switch during the present scan cycle, and the comparator indicates whether or not the same key switch has been actuated during two successive scan cycles. If the key switch has been held down during two successive scan cycles a key detect signal will not be generated for this particular key switch, but it will be generated upon the initial actuation of another key switch, thus providing the desired N-Key Rollover Protection System. A similar N-key rollover protection system is provided in the present keyboard, as will now be described. The OR gate 406 has been added to provide for the additional feature of delaying the operation of the N-key rollover protection system until an actuated key has been detected in two consecutive scan cycles. This feature provides a measure of protection against electrical noise such as may occur from static discharge, or other noise sources.

The output of the AND gate 401 is coupled on the line 415 to the D input of the D type flip-flop 416. The Q output of the flip-flop 416 provides an input signal to the shift-register 410 on the line 418 under the control of the $p_2$ clock signal applied to the clock input terminal 420 of the flip-flop 416. The signal stored in the shift register is shifted from stage to stage upon the application of the $p_4$ clock signal to the clock input line 422. The output of the shift register 410 is supplied on the line 424 which is labelled SR OUT. The output of the shift register 410 is also applied on the line 408 to the OR gate 406 so that a logic "1" level signal on the line 408 will pass through the AND gate 401 if a logic "1" level Data in signal is present on the line 400 at the same time. This allows a logic "1" level signal to pass through the AND gate 401 and in effect be recirculated through the shift register 410 when a keyswitch is maintained in an actuated state. The initial sending of a logic "1" level signal to the input of the shift register 410, however, occurs via the input line 412 to the OR gate 406. The comparison gate required to accomplish N-key rollover is the NAND gate 536. The output of the shift register 410 is coupled on the line 428 to the input of an inverter 430, the output of which is coupled on the line 432 to one input of the NAND gate 426. The second input of the NAND gate 426 receives the Data In signal on the line 434, the third input of the NAND gate 426 receives the $p_1$ clock signal on the line 436 as a timing signal. A logic "0" level output signal will thus be supplied to the line 438 to the set input of the flip-flop 440 when all of three input lines are at a logic "1" level.

When a particular keyswitch is first actuated, the output of the shift register 410 on the line 428 will be at a logic "0" level, hence, the output of the inverter 430 on the line 432 will be at a logic "1" level, and the Data-In signal on the line 400 will simultaneously be at a logic "1" level. The flip-flop 440 will be set upon the simultaneous application of a logic "0" level signal from the NAND gate 426 on the line 438 and a logic "1" level signal on the input line 444 to the flip-flop 440 from the NAND gate 442. With the keyswitch in question actuated, the output of the NAND gate 426 will be at a logic "0" level upon the first detection of a keyswitch, as signified by a logic "1" level Data In Signal on the line 400. Therefore, if the output of the NAND gate 442 is simultaneously at a logic "1" level, the flip-flop 440 will thus be set upon the initial detection of an actuated keyswitch.

When the flip-flop 440 is set by the initial key detection, the output of the NAND gate 450 on the line 452 which is connected to the set input of the flip-flop 454 goes to a logic "0" level upon the occurrence of a logic "1" level $p_4$ clock signal on the input line 458 to the gate 450 since the line 456 to the other input of the gate 450 will be at a logic "1" level at this time. A logic "0" level signal on the line 452 thus enables the flip-flop 454 to be set upon the occurrence of a logic "1" level signal on the input line 460 to the reset input of the flip-flop 454.

The AND gate 462 has one input coupled to the set output terminal of the flip-flop 440 on the line 464. The other input of the AND gate 462 is coupled on the line 446 to the reset output terminal of the flip-flop 454. The output of the AND gate 462 is coupled on the line 468 to one input of the OR gate 470. Thus a logic "1" level signal will be supplied on the output line 472 from the OR gate 470 when both of the inputs to the AND gate 462 are at a logic "1" level. Both inputs of the AND gate 462 will be at a logic "1" level while the flip-flop 440 is set and the flip-flop 454 is reset. Thus upon the initial keyswitch detection the two inputs to the AND gate 462 will be at a logic "1" level, causing a logic "1" level output signal to appear on the line 472 to the Address Latch 474, which serves to latch the address bits on the lines 482 into the Address Latch 474. In order to reset the flip-flop 440 the line 448 from the output of the type D flip-flop 414 must be at a logic "1" level. This will occur during the time frame of the second consecutive scan cycle of the associated actuated keyswitch. Therefore, when the $p_1$ signal on the line 436 goes to a logic "0" level, the flip-flop 440 will be reset when an overlapping logic "1" level $p_2$ signal occurs on the line 446. In other words the flip-flop 440 will be reset upon the "fall" or trailing edge of the $p_1$ signal from a logic "1" level to a logic "0" level, as shown in FIG. 3. If a comparison is not made between the codes of the first two cycles, the flip-flop 414 will not provide the necessary logic "1" level pulse to the OR gate 406 that is required to load a logic "1" level signal into the register 410, and consequently an output SR OUT signal on the line 424 will not be generated.

The Address Latch 474 receives the counter bits A1–A7 on the input lines 482 and stores this information when the logic level "1" gating signal on the line 472 appears, at which time the information in the Address Latch will be gated into the Address Latch 474. The comparator 476 compares the counter bits A1–A7 on the lines 484 from the preceding scan cycle with the current address bits A1–A7 on the input lines 486. The comparator provides a logic "1" level output signal on the line 487 each time a comparison is made between successive scan cycles, thereby providing insurance that the correct code is being transmitted for a depressed key and that electrical noise has not caused an erroneous code to be developed. The output signal from the comparator on the line 487 is provided to the D input of a D type flip-flop 414 which receives a $p_6$ clock signal as a clocking pulse on the line 488.

The logic "1" level output signal from the flip-flop 414 when a comparison has been made results in a logic "0" level output signal on the line 460 when a logic "1" level $p_2$ signal is on the line 446. With a logic "0" level signal on the line 460 the flip-flop 454 will be reset.

The AND gate 477 has one input on the line 478 from the reset output terminal of the flip-flop 454 and another input on the line 480. The lines 480 is coupled to the line 387 of FIG. 2B to receive the output signal from the AND gate 392 which is designated ($0 \cdot p_6$). This means that a logic "1" level signal appears on these lines when both the $p_6$ clock signal is at a logic "1" level and a zero location is decoded by the function flag decoder 202. The zero location is exclusively associated with functions rather than data. The AND gate 477 is under control of the signals on the lines 478 and 480 which serve to gate all logic "0" level data bits into the comparator 476 upon the occurrence of a zero location. When the flip-flop 454 is in its reset state the AND gate 477 accomplishes the gating of the bits A1–A7 on the lines 482 into the Address Latch each time a zero location occurs.

The AND gate 490 supplies its output signal on the line 492 to the NAND gate 494 (FIG. 2B), which is a control gate for the first and second stage Repeat Permit flip-flops 496, 498. When the zero location $\overline{0}$ signal on the input line 396 to the NAND gate 382 is at a logic "0" level, the NAND gate 382 will provide a logic "1" level on the line 384 to the reset input terminal of the flip-flop 496 and a simultaneous logic "0" level on output line 501 from the NAND gate 494 will then cause the flip-flop 496 to be set. One input to the NAND gate 494 is coupled to the line 520 from the inverter 522. The input of the inverter 522 is coupled to the line 524 which receives an external $\overline{\text{Repeat Permit}}$ signal, which externally commands a repeat of the detected key code. The flip-flop 496 will be reset when no repeat key code is detected and a logic "1" level signal is supplied on the input line 396 while a logic "1" level $p_5$ signal is present on the line 380.

When the flip-flop 496 is reset, its reset output terminal couples a logic "1" level signal on the line 504 to one input of the NAND gate 506. The NAND gate 506 will thus provide a logic "0" level output signal on the line 508 to the reset input terminal of the flip-flop 498 when the input line 386 from the output of the AND gate 392 is also at a logic "1" level. Therefore, if the key code detected is not a repeat code, both of the flip-flops 496, 498 are reset, with the flip-flop 498 being reset in the scan time following the scan time during which the flip-flop 496 was reset.

In order to set the flip-flops 496, 498 the NAND gate 494 must provide a logic "0" signal on the lines 500, 501, the input line 492 from the AND gate 490 must thus be at a logic "1" level; the $p_2$ signal on the line 502 must be at a logic "1" level. The signal on the input line 514 from the AND gate 401 must also be at a logic "1" level, which will occur upon the first and each subsequent detection of a depressed Data Keyswitch. The $\overline{0}$ signal on the input line 516 to the AND gate 490 must also be at a logic "1" level. In addition, a logic "1" level $\overline{\text{Function}}$ signal must be externally supplied on the line 518 indicating that a function code is not present.

Setting of the flip-flop 498 enables one input of the AND gate 526 on the line 510. The other input of the AND gate 526 is coupled to the line 528 to receive the reset output of the Upstroke Inhibit flip-flop 530. The flip-flop 530 will initially be reset after the detection of a keyswitch actuation and will remain reset until upstroke detection of this keyswitch occurs. The setting and resetting of the flip-flop 530 is controlled by the OR gates 532 (FIG. 2C) and 534 (FIG. 2B). The logic "1" level signal on the line 492 (FIG. 2C) from the AND gate 490 is supplied to one input of the NAND gate 536, the other input of which is received on the line 538 from the output of the inverter 430. Thus, the NAND gate 536 will provide a logic "0" level output signal, which is labelled $\overline{ST_1}$, on the line 540 only upon the occurrence of the first keyswitch code detection, since the output of the inverter 430 will go to a logic "0" level upon the second and subsequent detections.

The $\overline{ST_1}$ signal on the line 540 is supplied to one input of the OR gate 534 (FIG. 2B) on the line 541. The other input of the OR gate 534 is coupled to receive the $\overline{p_1}$ signal on the line 542 so that the output of the OR gate 534 on the line 544 will go to a logic "0" level when both input signals are at a logic "0" level. The output of the OR gate 534 is supplied on the line 544 to the reset input terminal of the Upstroke Inhibit flip-flop 530, which allows flip-flop 530 to be reset upon the simultaneous occurrence of a logic "1" level signal on the line 546 to its set input terminal. The line 546 is from the output of the OR gate 532 (FIG. 2C) and will be at a logic "1" level whenever any of the inputs to the OR gate 532 are at a logic "1" level; Thus, the flip-flop 530 will be reset when a data keyswitch is first actuated. When the actuated keyswitch is released the Data In signal, which is supplied on the line 401 to one input of the OR gate 532, will be at a logic "0" level; and the output of the inverter 430 on the line 550 will be at a logic "0" level upon the release of the keyswitch. If the external code supplied on the line 554, labelled $\overline{\text{Upstroke Select}}$, is also at a logic "0", and the $\overline{p_2}$ signal on the line 548, the Data In signal on the line 400 and the output of the inverter 394 on the line 398 are all at logic "0" levels, then the output of the OR gate 532 on the line 546 will be at a logic "0" level. A logic "0" level on the line 546 will set the flip-flop 530 upon the occurrence of a logic "1" level signal on the line 544. The output line 528 will thus go to a logic "0" level and inhibit the operation of the AND gate 526 when an actuated data keyswitch is released.

The NAND gate 556 has the input coupled to the output of the NAND gate 536 and a second input coupled to the output of the OR gate 532, to supply the ST signal on the line 172 to the Data Latch 158 (FIG. 2D), that was previously mentioned in the description of FIG. 2D. The Upstroke Inhibit flip-flop 530 will be reset upon the first actuation of a keyswitch and the Repeat Permit flip-flop 498 will be set. The AND gate 526 will then supply a logic "1" level signal on the output line 560 which is coupled to one input of the AND gate 562 and also to the line 561 that is coupled to the AND gate 563. The output of the AND gate 563 is coupled to the clear line 565 for the flip-flops 226–233 and 260–266. The other input of the AND gate 563 is coupled to the input line 564 and receives the $\overline{\text{STOD}}$, or delayed strobe signal from the output of the NAND gate 329. Thus, when a keyswitch is to be repeated the counter sections 219, 220 are allowed to go to their preset states when a logic "1" level signal appears on the line 561 and a logic "1" level delayed strobe, or $\overline{\text{STOD}}$, signal is provided on the line 564 so that a logic "0" level clear signal is normally applied by the gate 563 to the flip-flops 226–233 and 260–266. The flip-flops 226–233 and 260–266 will be all cleared after the $\overline{\text{Strobe}}$ signal on the line 323 has gone to a logic "1" level due to the logic "0" level delayed strobe, or $\overline{\text{STOD}}$, signal that is applied on the line 564 or by a logic "0" level signal on the line 561.

The output flip-flop 267 of the counter section 220 is separately cleared by a logic "0" level signal on the line 566 from the set output terminal of the Auto Repeat Permit flip-flop 568, when this flip-flop is in its reset state. When the flip-flop 568 is set the output line 566 will be at a logic "1" level and the flip-flop 267 will be able to provide an output signal on the line 280. The flip-flop 568 will be reset only if a logic "0" level signal appears on the output line 570 of the AND gate 562 to the reset input terminal of the flip-flop 568, and a logic "1" level signal simultaneously appears on the output line 572 of the OR gate 574 to the set input terminal of the flip-flop 568.

The AND gate 562 in addition to the input line 560 from the AND gate 526 has an input coupled on the line 576 from the output of the OR gate 578. The AND gate 562 will thus provide a logic "1" level output signal on the line 570 when the input lines 560 and 576 are both at logic "1" levels. The $p_1$ clock signal is coupled on the input line 580 to one input of the OR gate 574 and a $\overline{p_1}$ clock signal is coupled on the line 581 to one input of the OR gate 578. The $\overline{ST_1}$ signal is coupled on the lines 582 and 583 to the other input of both of the OR gates 574, 578. The $\overline{ST_1}$ signal goes to a logic "0" level upon the occurrence of this signal from the NAND gate 536 (FIG. 2C) when the first strobe for an actuated keyswitch has been detected. The third input to the OR gate 574 is from the line 585 which carries an external signal labelled either Auto Repeat or a 0 signal from the line 587. When the signal on the line 572 is at a logic "0" level, the flip-flop 568 will be set, thereby releasing the clear on the output flip-flop 267 of the counter section 220. Thus, when the $\overline{\text{Auto Repeat}}$ signal occurs the repeat time of keyswitch code for the first repeated code will be determined by the time period established by both counter sections 219, 220 since the entire counter is effective for the first repeated code. The $\overline{0}$ signal, or zero location signal associated with functions, is supplied on the line 590 and is coupled through the buffer 592 before being supplied to the line 587.

After the $\overline{ST_1}$ signal on the lines 582 and 583 returns to a logic "1" level the flip-flop 568 will remain set until the AND gate 526 provides a logic "0" level signal on the line 560. This can occur if either the Upstroke Inhibit flip-flop 530 is set or the Repeat Permit flip-flop 498 is reset. Since the $\overline{\text{Repeat Permit}}$ signal on the line 524 remains at a logic "0" level when the $\overline{\text{Auto Repeat}}$ signal on the line 585 is at a logic "0" level the Repeat Permit flip-flop 498 will remain set. Therefore, the line 561 will remain at a logic "1" level after the key has been depressed, but because of the setting of the flip-flop 568, the output line 566 to the clear input terminal of the output flip-flop 267 of the counter section 220 will go to a logic "1" level. Thus, for each repeated code after the first one a shorter repeat delay interval that is determined only by the counter section 219, will be effective instead of the longer delay interval that was determined for the first repeated code by both of the counter sections 219 and 220.

What is claimed is:

1. An electrical keyboard comprising a plurality of selectively operable keyswitch matrix elements each having an actuated state and an unactuated state, and output means for scanning and sensing the state of each of said keyswitch matrix elements in a sequential cyclic manner comprising a master counter of N count stages, wherein N is a number sufficiently large so that each keyswitch matrix element may be associated with a unique count of said master counter, output encoding means for producing an initial output code that is derived from the count of said master counter which is associated with a particular keyswitch matrix element that has been actuated, repeat means for selectively repeating said output code comprising timing means for controlling the delay between said initial output code and a repeated output code wherein said repeat means comprises a programmable delay timing counter having M serially-coupled counting stages wherein at least a plurality of said counting stages may be individually initially programmed, where M is selected in accordance with the range of the desired delay, gate encoding means for encoding preselected counts of said master counter in order to provide a separate gating signal for each stage of said delay timing counter which is capable of being programmed and gating means for controlling the selective programming of said programmable stages in accordance with said gating signals and upon the application of an externally supplied program permit signal to said gating means simultaneously with the application of said gating signals from said gate encoding means to said gating means.

2. An electrical keyboard as claimed in claim 1 further comprising upstroke select means coupled to said output means for detecting when an actuated keyswitch matrix element is deactuated and for inhibiting said repeat means from allowing the outputting of futher output codes associated with said previously actuated keyswitch matrix element.

3. An electrical keyboard as claimed in claim 1 wherein M=N and said delay timing counter has two sections that are coupled in series and the first section comprises R count stages while the second section comprises N—R count stages, and said stages of each section are individually programmable by said gating means further comprising control means for said delay timing counter which cooperates with said delay timing counter so that said first and second sections together control the delay time between the initial output code associated with an actuated keyswitch matrix element and the first repeated output code, and said second section alone controls the delay time between the first repeated output code and each subsequent output code that is repeated for said keyswitch matrix element.

4. An electrical keyboard as claimed in claim 3 wherein a plurality of the most significant count bits of said master counter are used by said gate encoding means to control the stages of said delay timing counter that are programmed and the remaining least significant bits of said master counter are all at the same logic level when said counting stages of said programmed stages of said delay timing counter are being programmed.

5. An electrical keyboard as claimed in claim 4 further comprising upstroke select means coupled to said output means for detecting when an actuated keyswitch matrix element is deactuated and for inhibiting said repeat means from allowing the outputting of further output codes associated with said previously actuated keyswitch matrix element.

* * * * *

UNITED STATES PATENT AND TRADEMARK OFFICE
CERTIFICATE OF CORRECTION

PATENT NO. : 4,263,582

DATED : April 21, 1981

INVENTOR(S) : Steve Dumbovic

It is certified that error appears in the above-identified patent and that said Letters Patent are hereby corrected as shown below:

Column 4, line 31, "receivers" should read "receives".
Column 5, line 2, "78" should read "76".
Column 5, line 9, "with" should read "of".
Column 10, line 61, "0" should read "$\overline{0}$".
Column 12, line 19, "in" should read "In".

Column 17, line 8, "futher" should read --further--.

Signed and Sealed this

*Twenty-fifth* Day of *August 1981*

[SEAL]

*Attest:*

GERALD J. MOSSINGHOFF

*Attesting Officer* *Commissioner of Patents and Trademarks*